US008923025B2

(12) United States Patent
Rastogi et al.

(10) Patent No.: US 8,923,025 B2
(45) Date of Patent: Dec. 30, 2014

(54) APPARATUS AND METHODS FOR FEEDBACK SENSING IN MULTI-CELL POWER SUPPLIES

(71) Applicants: Mukul Rastogi, Murrysville, PA (US); Daniel Edward Erb, Harrison City, PA (US); Edward Alan Cheesman, Chicora, PA (US)

(72) Inventors: Mukul Rastogi, Murrysville, PA (US); Daniel Edward Erb, Harrison City, PA (US); Edward Alan Cheesman, Chicora, PA (US)

(73) Assignee: Siemens Industry, Inc., Alpharetta, GA (US)

( * ) Notice: Subject to any disclaimer, the term of this patent is extended or adjusted under 35 U.S.C. 154(b) by 99 days.

(21) Appl. No.: 13/754,208

(22) Filed: Jan. 30, 2013

(65) Prior Publication Data

US 2014/0210431 A1    Jul. 31, 2014

(51) Int. Cl.
| | | |
|---|---|---|
| *H02M 5/458* | (2006.01) | |
| *G05F 1/00* | (2006.01) | |
| *G01R 19/00* | (2006.01) | |
| *H02M 7/49* | (2007.01) | |
| *H02M 7/493* | (2007.01) | |
| *H02M 1/00* | (2006.01) | |

(52) U.S. Cl.
CPC .............. *G05F 1/00* (2013.01); *G01R 19/0092* (2013.01); *H02M 7/49* (2013.01); *H02M 7/493* (2013.01); *H02M 2001/0009* (2013.01)
USPC .................................. 363/79; 363/34; 363/65

(58) Field of Classification Search
USPC .......................... 363/34, 35, 37, 65, 71, 78, 79
See application file for complete search history.

(56) References Cited

U.S. PATENT DOCUMENTS

| | | | |
|---|---|---|---|
| 5,625,545 A | | 4/1997 | Hammond |
| 5,638,263 A | * | 6/1997 | Opal et al. ...................... 363/65 |
| 6,014,323 A | | 1/2000 | Aiello |
| 6,166,513 A | | 12/2000 | Hammond |
| 7,477,037 B2 | | 1/2009 | Amorino |
| 7,508,147 B2 | | 3/2009 | Fukuta |
| 8,169,107 B2 | | 5/2012 | Hammond |
| 8,279,640 B2 | * | 10/2012 | Abolhassani et al. .......... 363/37 |
| 2006/0274560 A1 | | 12/2006 | Fukuta |
| 2007/0035261 A1 | | 2/2007 | Amorino |
| 2009/0302682 A1 | | 12/2009 | Hammond |
| 2010/0142234 A1 | | 6/2010 | Abolhassani et al. |
| 2012/0113701 A1 | | 5/2012 | Wang |
| 2012/0275202 A1 | | 11/2012 | Yamamoto et al. |

OTHER PUBLICATIONS

PCT International Search Report mailed Oct. 7, 2014 corresponding to PCT International Application No. PCT/US2014/013707 filed Jan. 30, 2014 (11 pages).

* cited by examiner

*Primary Examiner* — Gary L Laxton (57) ABSTRACT

Apparatus and methods in accordance with this invention provide a multi-cell power supply for receiving power from a source and delivering power at an output terminal to a load. The multi-cell power supply includes a first power cell coupled to the source, and a first current sensor circuit. The first power cell provides a first output current, and includes a first output terminal coupled to a reference node of the multi-cell power supply, and a second output terminal coupled to the output terminal. The first current sensor circuit includes a first current sensor and a power supply. The first current sensor is coupled to the first output terminal of the first power cell, and measures the first output current. The power supply is coupled to either the reference node or a floating ground node of the first power cell, and provides power to the first current sensor.

20 Claims, 11 Drawing Sheets

APPARATUS AND METHODS FOR FEEDBACK SENSING IN MULTI-CELL POWER SUPPLIES

BACKGROUND

This invention relates to multi-cell power supplies. More particularly, this invention relates to apparatus and methods for feedback sensing in multi-cell power supplies.

SUMMARY

In a first aspect of the invention, a multi-cell power supply is provided for receiving power from a source and delivering power at an output terminal to a load. The multi-cell power supply includes a first power cell coupled to the source, and a first current sensor circuit. The first power cell provides a first output current, and includes a first output terminal coupled to a reference node of the multi-cell power supply, and a second output terminal coupled to the output terminal. The first current sensor circuit includes a first current sensor and a power supply. The first current sensor is coupled to the first output terminal of the first power cell, and measures the first output current. The power supply is coupled to either the reference node or a floating ground node of the first power cell, and provides power to the first current sensor.

In a second aspect of the invention, a multi-cell power supply is provided for receiving power from a source and delivering power at an output terminal to a load. The multi-cell power supply includes a first power cell coupled to the source. The first power cell includes a first output terminal coupled to a reference node of the multi-cell power supply, a second output terminal coupled to the output terminal, and a first resistor network, a second resistor network, and a floating ground node. The first resistor network is coupled between the first output terminal of the first power cell and the floating ground node of the first power cell. The second resistor network is coupled between the second output terminal of the first power cell and the floating ground node of the first power cell. The first resistor network provides a first feedback voltage of the first power cell, and the second resistor network provides a second feedback voltage of the first power cell.

In a third aspect of the invention, a method is provided for use with a multi-cell power supply that receives power from a source and delivers power at an output terminal to a load. The method includes: (a) coupling a first power cell to the source, the first power cell providing a first output current; (b) coupling a first output terminal of the first power cell to a reference node of the multi-cell power supply; (c) coupling a second output terminal of the first power cell to the output terminal; (d) coupling a first current sensor circuit to the first power cell, the first current sensor circuit including a first current sensor and a power supply; (e) coupling the first current sensor to the first output terminal of the first power cell; (f) coupling the power supply of the first current sensor circuit to either the reference node or a floating ground node of the first power cell, wherein the power supply of the first current sensor circuit provides power to the first current sensor; and (g) using the first current sensor to measure the first output current.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIG. 1A is a block diagram of a previously known multi-cell power supply;

FIG. 1B is a more detailed block diagram of the previously known multi-cell power supply of FIG. 1A;

FIG. 2 is a block diagram of an example multi-cell power supply in accordance with this invention;

FIG. 3A is a block diagram of an example power circuit of the multi-cell power supply of FIG. 2;

FIG. 3B is a block diagram of an alternative example power circuit of the multi-cell power supply of FIG. 2;

FIG. 3C is a block diagram of another alternative example power circuit of the multi-cell power supply of FIG. 2;

FIG. 4A is a block diagram of an example current sensor circuit and power cell of the multi-cell power supply of FIG. 2;

FIG. 4B is a block diagram of an alternative example current sensor circuit and power cell of the multi-cell power supply of FIG. 2;

FIG. 5 is a block diagram of an alternative example multi-cell power supply in accordance with this invention;

FIG. 6 is a block diagram of an example power circuit of the multi-cell power supply of FIG. 5; and FIG. 7 is a block diagram of an example power cell of the multi-cell power supply of FIG. 5.

DETAILED DESCRIPTION

Previously known multi-cell power supplies, such as described in Hammond U.S. Pat. No. 5,625,545, Aiello et al. U.S. Pat. No. 6,014,323, Hammond U.S. Pat. No. 6,166,513, Rastogi et al. U.S. Pat. No. 7,508,147, and Hammond et al. U.S. Pat. No. 8,169,107, each of which is incorporated by reference herein in its entirety for all purposes, use modular power cells to deliver medium-voltage power to a load, such as a three-phase AC motor.

As used herein, a "medium voltage" is a voltage of greater than about 690V and less than about 69 kV, and a "low voltage" is a voltage less than about 690V. Persons of ordinary skill in the art will understand that other voltage levels may be specified as "medium voltage" and "low voltage." For example, in some embodiments, a "medium voltage" may be a voltage between about 1 kV and about 69 kV, and a "low voltage" may be a voltage less than about 1 kV.

For example, FIGS. 1A-1B illustrate a previously known multi-cell power supply 10 that receives three-phase power from an AC source, and delivers power to a load 12 (e.g., a three-phase AC motor). As shown in FIG. 1A, multi-cell power supply 10 includes a transformer 14, a power circuit 16, a controller 18, a current sensor 20 and a resistor network that includes resistors R1 and R2.

As shown in FIG. 1B, transformer 14 includes a primary winding 14*p* that excites nine secondary windings 14*s*1-14*s*9, and power circuit 16 includes power cells 16*a*1, 16*b*1, . . . , 16*c*3 that are coupled to secondary windings 14*s*1-14*s*9, respectively, of transformer 14. Power cells 16*a*1, 16*b*1, . . . , 16*c*3 are configured to provide medium voltage output power to load 12.

In particular, each output phase of power circuit 16 is fed by a group of series-connected power cells 16*a*1, 16*b*1, . . . , 16*c*3. Power cells 16*a*1, 16*a*2 and 16*a*3 are coupled in series in a first phase group, power cells 16*b*1, 16*b*2 and 16*b*3 are coupled in series in a second phase group, and power cells 16*c*1, 16*c*2 and 16*c*3 are coupled in series in a third phase group. Each phase output voltage is the sum of the output voltages of the power cells in the phase group. For example, if each of power cells 16a1, 16b1, ..., 16c3 has a maximum output voltage magnitude of about 600V, each phase of power circuit 16 can produce a maximum output voltage magnitude of about 1800V above neutral. In this regard, power circuit 16 delivers medium voltage power to load 12 using power cells 16a1, 16b1, ..., 16c3 that include components rated for voltages substantially lower than the rated output voltage.

Each of power cells 16a1, 16b1, ..., 16c3 is coupled (e.g., via an optical fiber communication link) to controller 18, which uses current feedback and voltage feedback to control the operation of power cells 16a1, 16b1, ..., 16c3. In particular, current sensors 20b and 20c sense the output current of power circuit 16, and provide output signals corresponding to the sensed currents to controller 18. The current corresponding to phase A is determined by the equation:

$$iA = -iB - iC$$

Current sensors 20b and 20c each may include a Hall-effect transducer that is coupled to a low voltage supply (e.g., ±15V), and provides a low voltage output signal proportional to the measured current. The low voltage supplies and output signals of current sensors 20b and 20c are directly connected to controller 18. Thus, current sensors 20b and 20c require isolation for rated output line-to-ground voltage (e.g., 2400V) for normal operation, and isolation for rated line-to-line voltage (e.g., 4160V) for operation under ground fault.

Commercially available current sensors, however, typically do not have such high isolation ratings. As a result, previously known multi-cell power supplies typically use special techniques to provide medium voltage isolation for current sensors 20b and 20c, such as using shielded cables through the current sensors. Such techniques require current sensors with large apertures to accommodate the larger conductor size of shielded cables, which increases the cost and complexity of current sensor implementation.

Figure 1A:
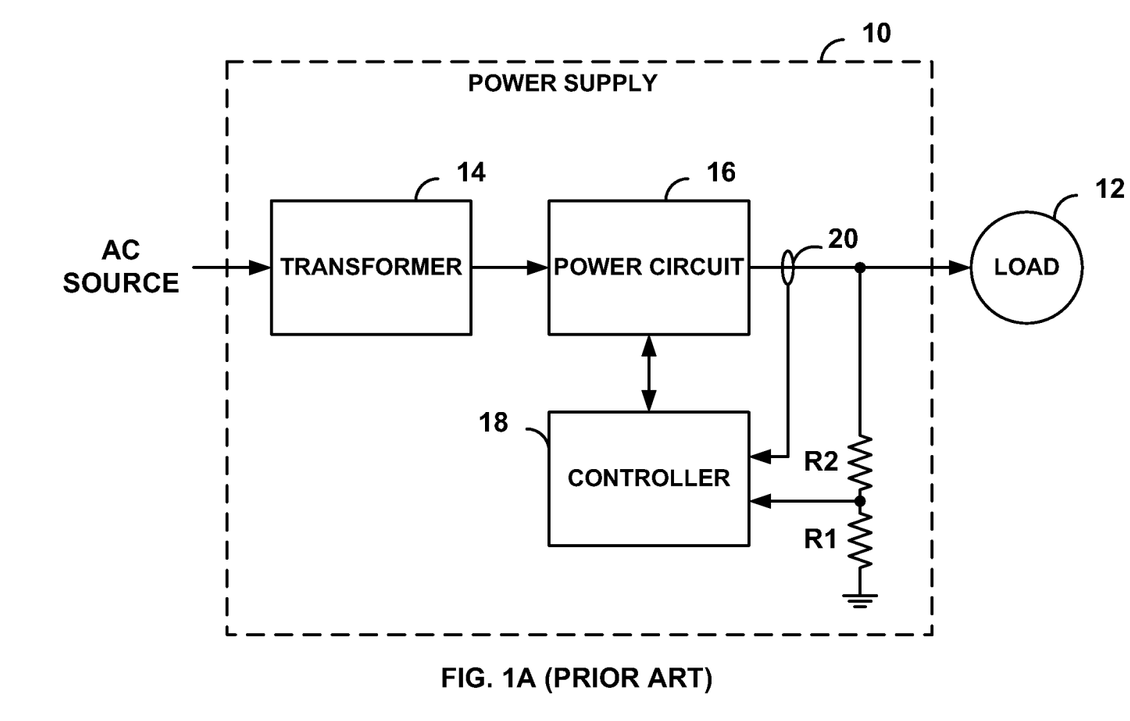
Figure 1B:
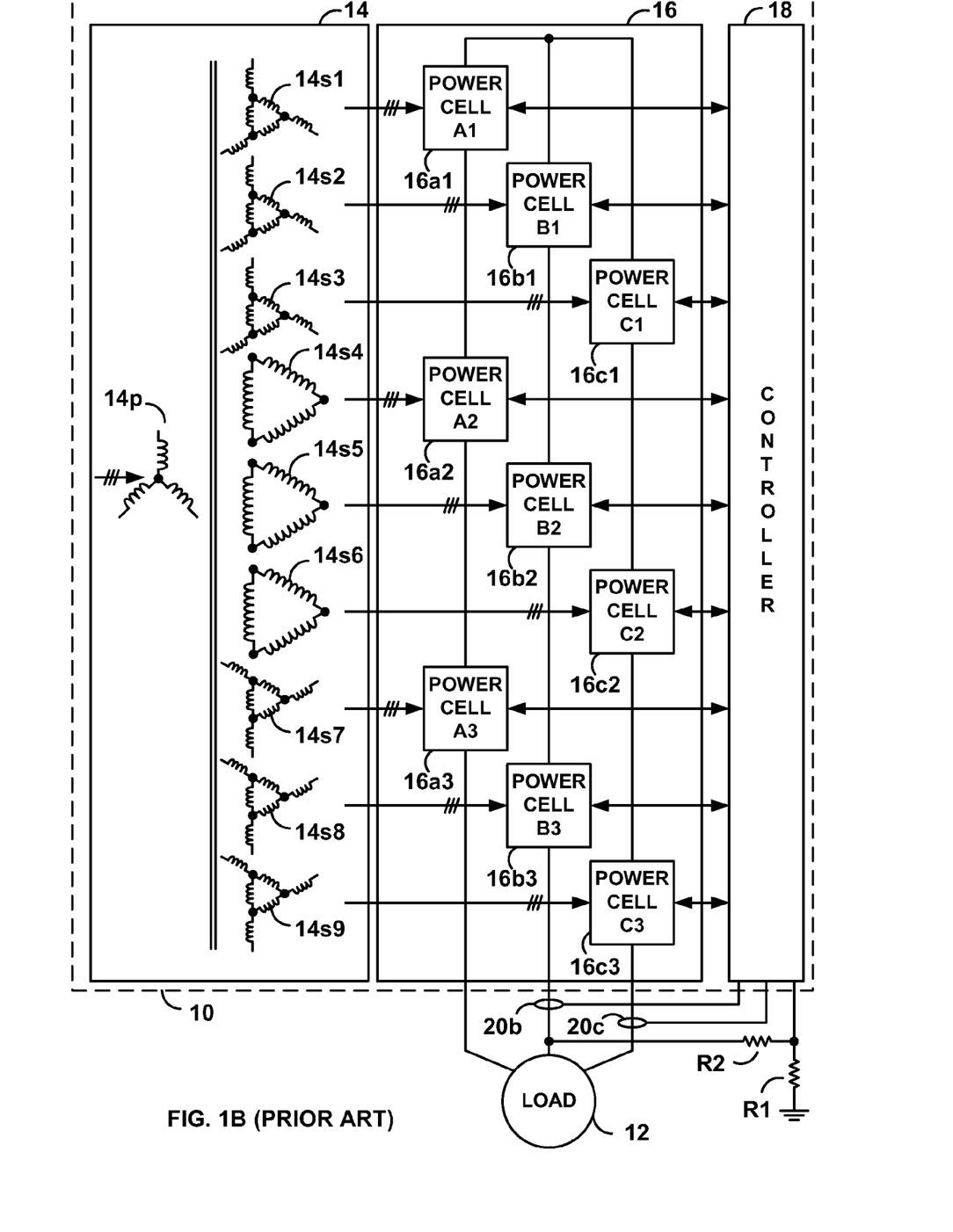

In addition, resistors R1 and R2 are coupled to the output bus of power circuit 16, and provide voltage feedback to controller 18. Typically, R2>>R1, such that the attenuated feedback voltage signal is much smaller than the rated output voltage of power circuit 16. For example, R1 may be about 4.8 kΩ, and R2 may be between about 1.7 MΩ to about 21 MΩ depending on the required output voltage of multi-cell power supply 10. To avoid obscuring the drawing, a single set of resistors R1 and R2 are shown coupled to a single phase output of power circuit 16 in FIG. 1B. Typically, separate sets of resistors R1 and R2 are coupled to each output phase of power circuit 16.

Resistor R2 typically is implemented using high voltage resistors, including multiple series-coupled resistors to mitigate the potential effect of failures. High voltage resistors are bulky, and the resistor network including R1 and R2 requires special testing to qualify for high voltage operation, and requires a dedicated space in the high voltage section of multi-cell power supply 10. In addition, because multi-cell power supply 10 may be used to provide a range of output voltages, different R2 values must be used depending on the required output voltage.

Further, the high voltage connections to resistor R2, and the low voltage feedback connections to resistor R1 and controller 18 require careful routing through cabinets where high voltages are present. Such routing of low voltage wiring can introduce noise into the feedback signals. All of these factors increase the cost and complexity of implementing voltage sensing using attenuator resistors.

Apparatus and methods in accordance with this invention provide current feedback for multi-cell power supplies using current sensor circuits that are powered by and coupled to the power cell whose current is being measured. In accordance with this invention, such current sensor circuits require isolation for the rated voltage of the power cell, and do not require isolation for the rated output line-to-ground voltage or rated line-to-line voltage of the power supply.

In addition, apparatus and methods in accordance with this invention provide voltage feedback for multi-cell power supplies using power cells that each include resistor networks coupled between the output terminals of the power cell, and a floating ground terminal of the power cell. The resistor network in each power cell provides voltage feedback signals for the power cell. The voltage feedback signals for each power cell in a phase group may be added to determine a voltage feedback signal for the phase group. As a result, the resistor networks in each power cell may use conventional resistors rather than the high voltage resistors required in previously known multi-cell power supplies.

Figure 2:
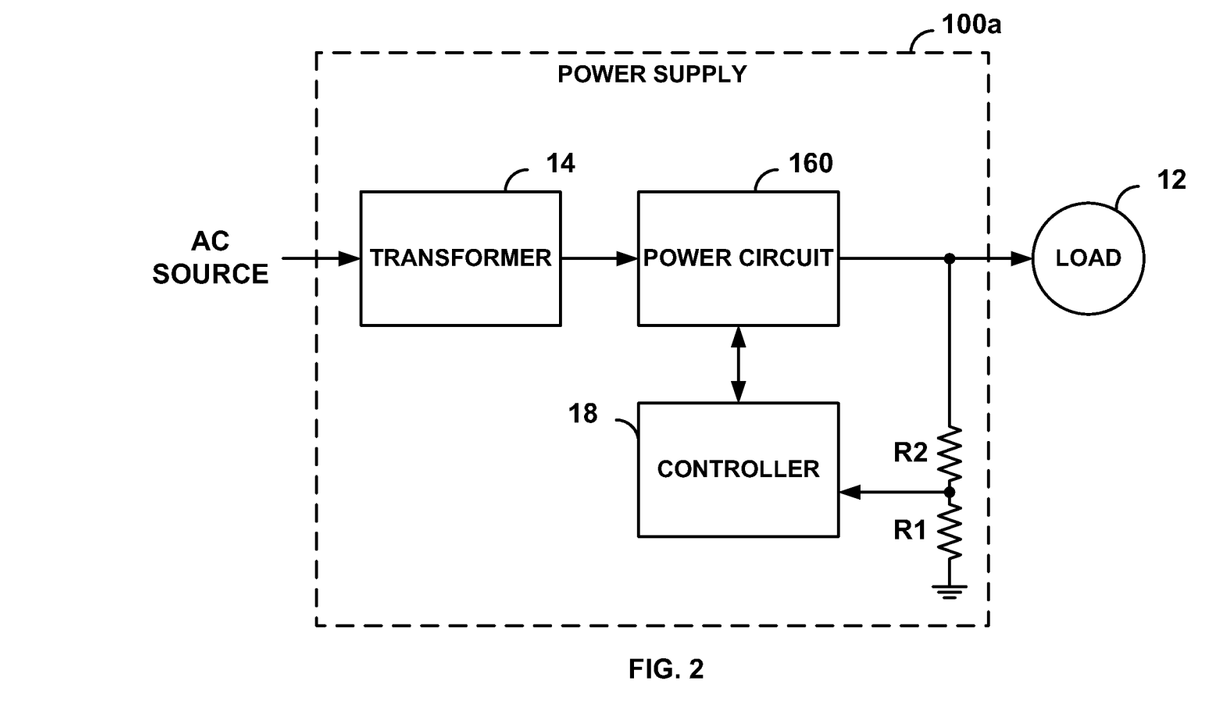

Referring now to FIG. 2, an example multi-cell power supply 100a in accordance with this invention is described. Multi-cell power supply 100a includes transformer 14, a power circuit 160, controller 18 and feedback resistors R1 and R2. As described in more detail below, unlike previously known multi-cell power supply 10 of FIG. 1A, multi-cell power supply 100a does not include current sensor 20 coupled to the output bus of power circuit 160.

Figure 3A:
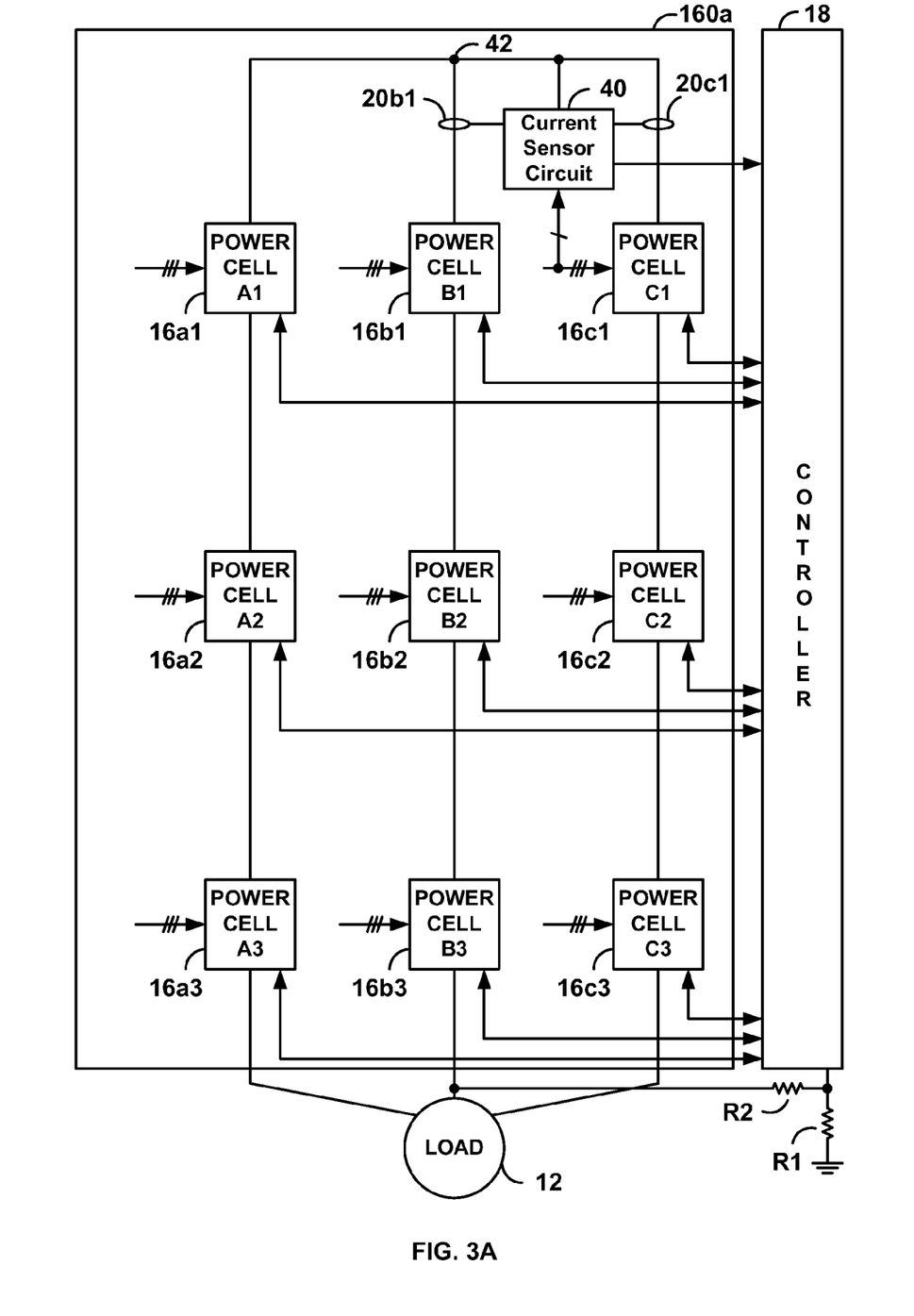

Referring now to FIG. 3A, an example embodiment of power circuit 160 is described. Power circuit 160a includes nine power cells 16a1, 16b1, ..., 16c3 that are coupled to transformer 14 (to avoid obscuring the drawing, transformer 14 is not shown) and are coupled via communication links to controller 18. Persons of ordinary skill in the art will understand that more or less than nine power cells 16a1, 16b1, ..., 16c3 may be used. In addition, persons of ordinary skill in the art will understand that transformer 14 may include different configurations of primary winding 14p and secondary windings 14s1-14s9, and may include more or less than nine secondary windings 14s1-14s9 than those depicted in FIG. 1B.

Each output phase of power circuit 160a is fed by a group of series-connected power cells 16a1, 16b1, ..., 16c3. Power cells 16a1, 16a2 and 16a3 are coupled in a first phase group, power cells 16b1, 16b2 and 16b3 are coupled in a second phase group, and power cells 16c1, 16c2 and 16c3 are coupled in a third phase group, with the three phase groups joined in a WYE connection at reference node 42. Persons of ordinary skill in the art will understand that more or less than three output phases may be used.

Power circuit 160a also includes a current sensing circuit 40 that is coupled to current sensors 20b1 and 20c1, power cell 16c1, controller 18 and reference node 42. Current sensors 20b1 and 20c1 may be any conventional current sensors, such as LT 2005-S current transducers by LEM Holding SA, Geneva, Switzerland. Persons of ordinary skill in the art will understand that other current sensors may be used. Current sensors 20b1 and 20c1 are adjacent reference node 42, and each have power terminals p and provide a measurement output signal at output terminal m.

Figure 4A:
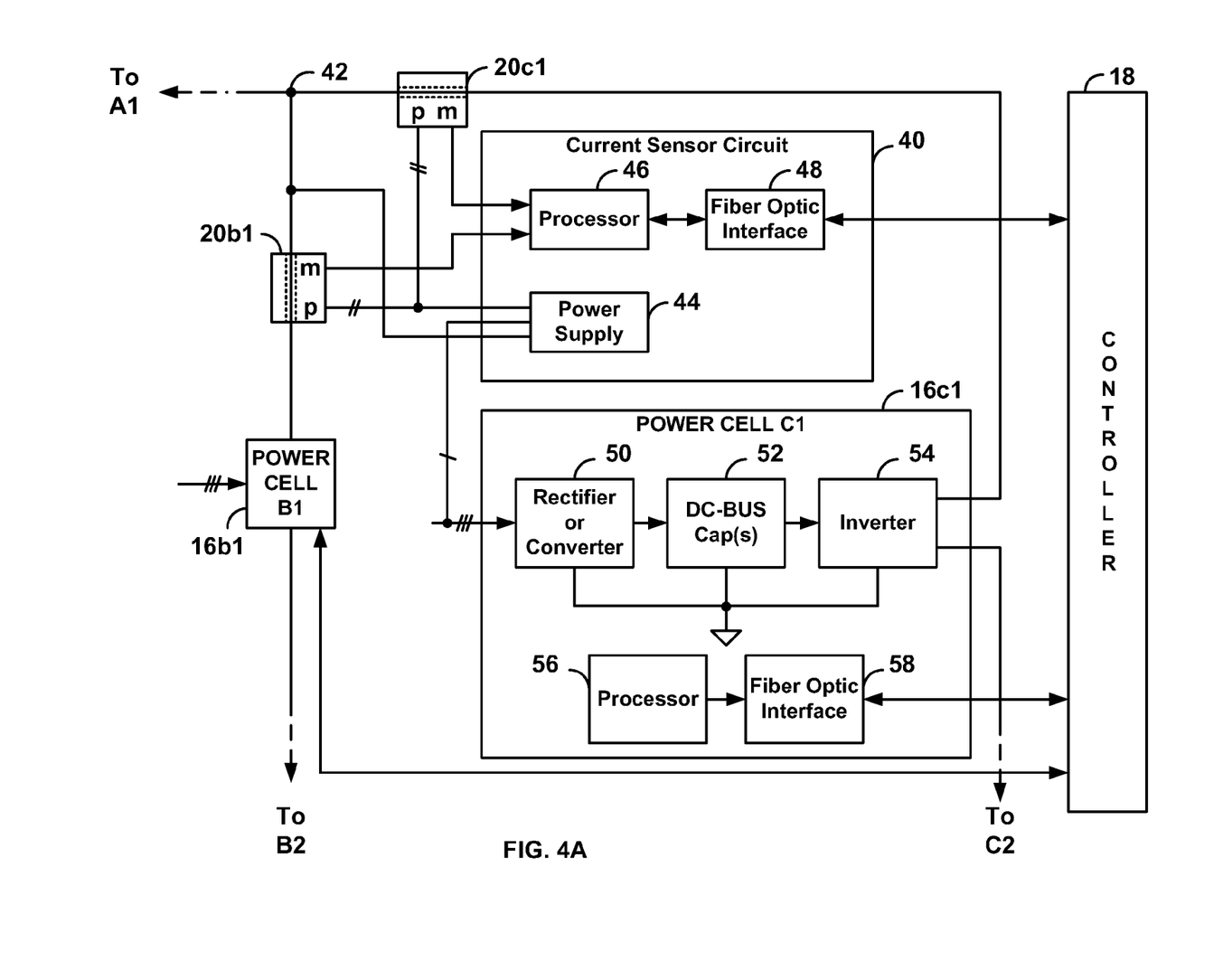

Referring now to FIG. 4A, an example current sensor circuit 40 is described. Current sensor circuit 40 includes a power supply 44, a processor 46 and a fiber optic interface 48. Power supply 44 includes a first input signal coupled to one or more phases of the three-phase input to power cell 16c1, and a second input signal coupled to reference node 42, and provides power (e.g., ±15 VDC) to power terminals p of current sensors 20b1 and 20c1. Power supply 44 may be any conventional AC-DC converter or other similar power supply.

Processor 46 has input terminals coupled to output terminals m of current sensors 20b1 and 20c1, and has an output terminal coupled to fiber optic interface 48. Processor 46 provides the measured output signals from current sensors 20b1 and 20c1 to controller 18 via fiber optic interface 48. Processor 46 may be a microprocessor, such as a TMS320F2801 processor by Texas Instruments, Dallas, Tex., a Programmable Gate Array device (such as FPGA from Altera or Xilinx) that can be configured to perform the functions of a processor, an op-amp based circuit with a V/f converter to transmit the sensed feedback over fiber-optics, or other similar processor or circuit. Fiber optic interface 48 is coupled between processor 46 and controller 18, and provides electrical isolation between current sensor circuit 40 and controller 18. Fiber optic interface 48 may be an AFBR 2624Z/AFBR 1624Z fiber optic receiver/transmitter pair by Avago Technologies, San Jose, Calif., or may be any other similar fiber optic interface.

Power cell 16c1 may be a conventional power cell that includes a rectifier 50, DC bus capacitor(s) 52, an inverter 54, a processor 56, and a fiber optic interface 58. Rectifier 50 converts the three-phase input AC signal to a substantially constant DC voltage coupled to DC bus capacitor(s) 52. Inverter 54 converts the DC voltage across DC bus capacitor(s) 52 to an AC output. Rectifier 50, DC bus capacitor(s) 52, and inverter 54 have a common floating ground node. A first output terminal of power cell 16c1 is coupled to reference node (WYE connection) 42, and a second output terminal of power cell 16c1 is coupled to power cell 16c2 (not shown in FIG. 4A).

Processor 56 may be coupled to controller 18 via fiber optic interface 58. Processor may be a TMS320F2801 processor, or may be any other similar processor. Fiber optic interface 58 may be an AFBR 2624Z/AFBR 1624Z fiber optic receiver/transmitter pair, or may be any other similar fiber optic interface. Processor 56 may communicate status information regarding power cell 16c1 to controller 18, and controller 18 may communicate control signals to processor 56 to control operation of power cell 16c1.

Current sensor 20b1 is coupled between the first output terminal of power cell 16b1 and reference node 42, current sensor 20c1 is coupled between the first output terminal of power cell 16c1 and reference node 42, and power supply 44 is coupled to reference node 42. This equalizes the isolation voltage stress on current sensors 20b1 and 20c1.

In addition, the isolation requirement for each of current sensors 20b1 and 20c1 equals the rated output voltage of power cell 16c1 (e.g., 480V). In contrast, current sensors 20b and 20c of previously known multi-cell power supply 10 of FIGS. 1A-1B, require isolation for the rated output-to-ground voltage (e.g., 2400V) during normal operation or require isolation for the rated line-line voltage of multi-cell power supply 10 (e.g., 4160V) during abnormal operation such as under an output ground fault condition. Thus, the isolation requirement for current sensors 20b1 and 20c1 is much lower than that required for current sensors 20b and 20c of previously known multi-cell power supply 10. In addition, the isolation requirement for current sensors 20b1 and 20c1 is not affected by the rated output voltage of multi-cell power supply 100a, or by the size of the shielded conductor used on the output bus of multi-cell power supply 100a.

In accordance with this invention, current sensor 20b1 measures an output current of power cell 16b1, and current sensor 20c1 measures an output current of power cell 16c1. The measured output current of power cell 16b1 substantially equals the "b" phase output current of power circuit 160a, and the measured output current of power cell 16c1 substantially equals the "c" phase output current of power circuit 160a. Thus, power circuit 160a provides current feedback to controller 18 without requiring high voltage isolation of current sensors 20b1 and 20c1.

Figure 3B:
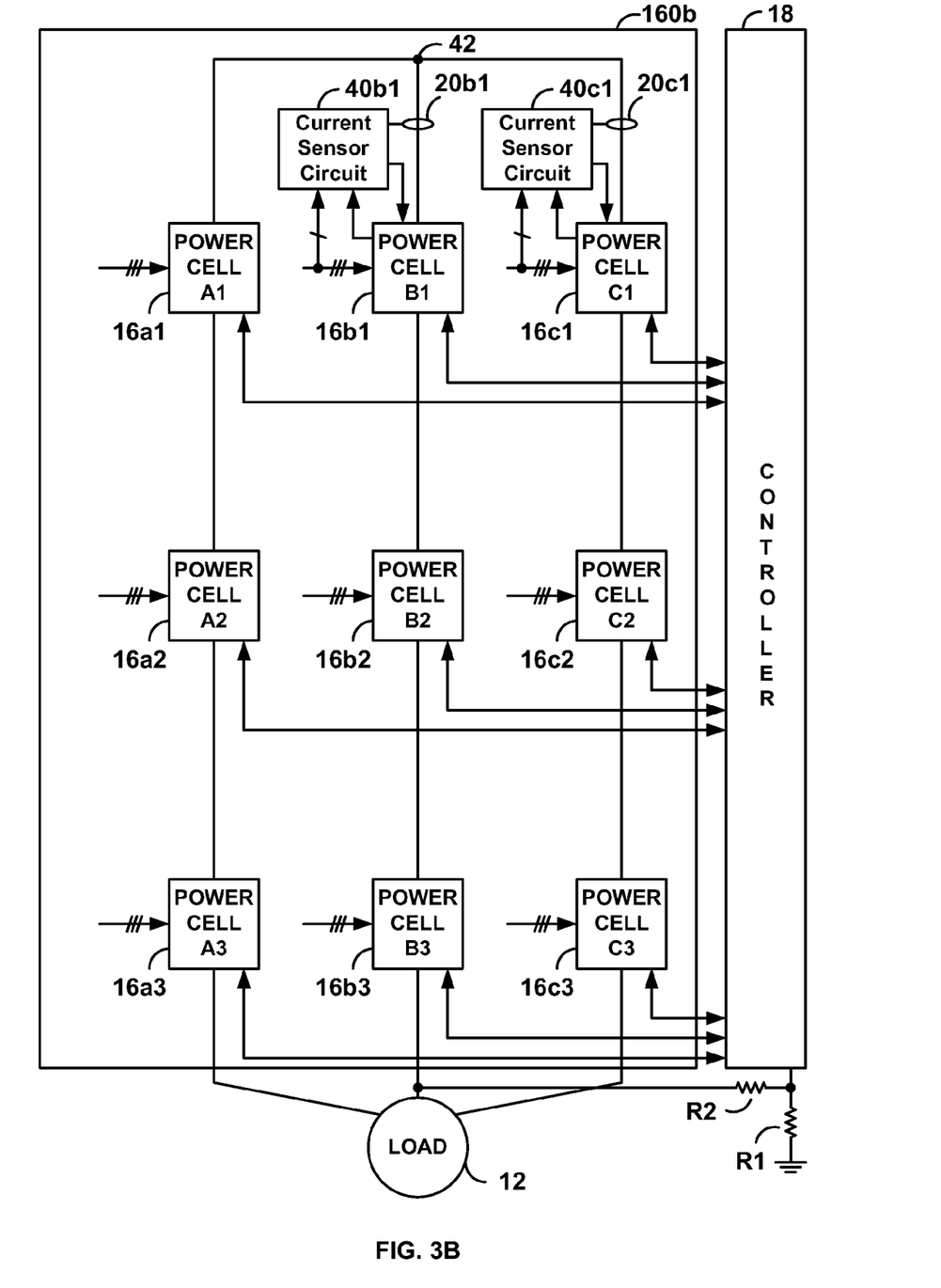

Referring now to FIG. 3B, an alternative example embodiment of power circuit 160 is described. In particular, power circuit 160b includes a first current sensor circuit 40b1 coupled to current sensor 20b1 and power cell 16b1, and a second current sensor circuit 40c1 coupled to current sensor 20c1 and power cell 16c1. In this regard, each of current sensors 20b1 and 20c1 is powered by the source supplying the corresponding power cell, and measures an output current of power cells 16b1 and 16c1, respectively.

Figure 4B:
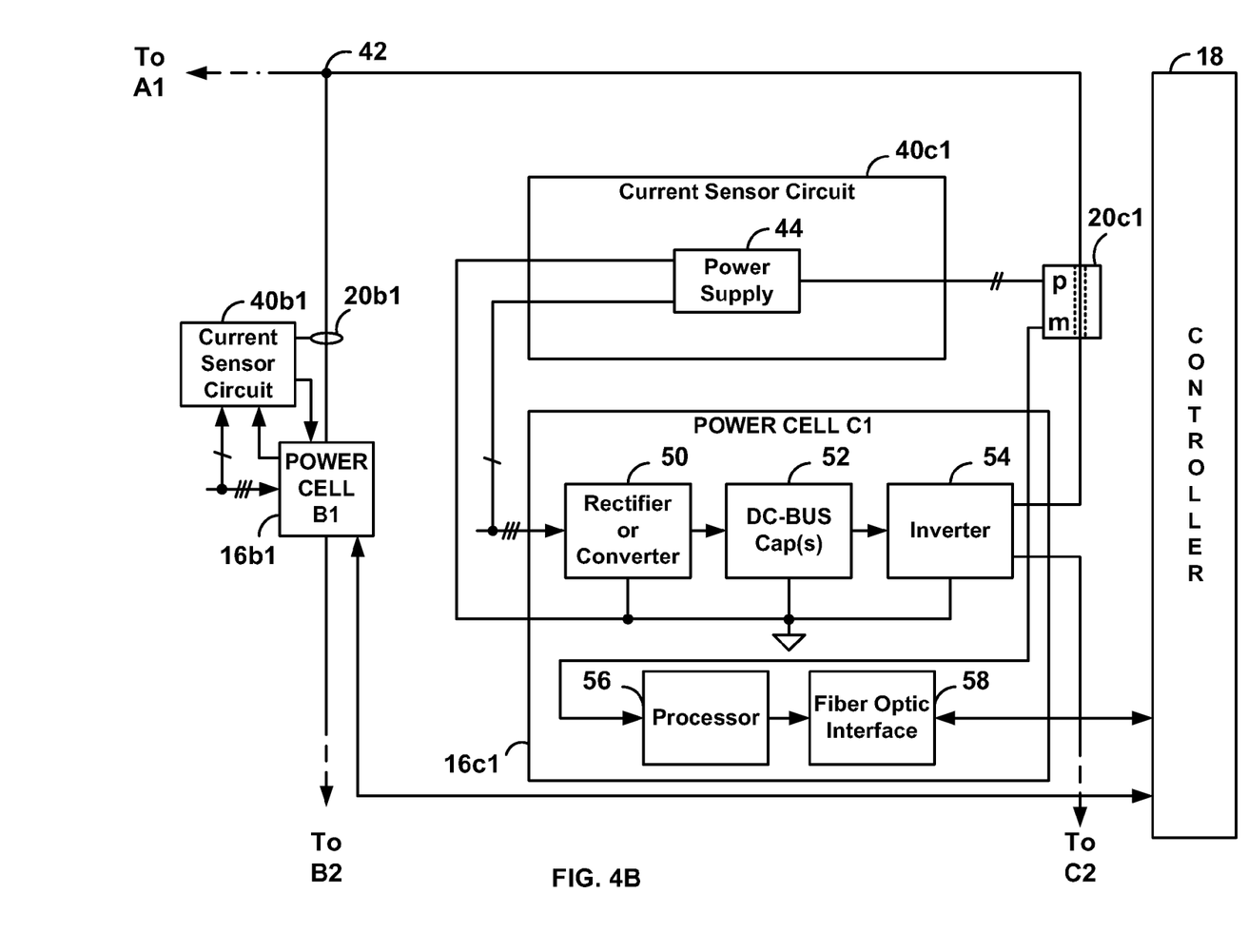

Referring now to FIG. 4B, an example current sensor circuit 40c1 is described. Current sensor circuit 40c1 includes power supply 44, which has a first input signal coupled to one or more phases of the three-phase input to power cell 16c1, a second input signal coupled to the floating ground of power cell 16c1, and provides power (e.g., ±15 VDC) to power terminals p of current sensor 20c1. Output terminal m of current sensor 20c1 is coupled to an input terminal of processor 56 of power cell 16c1.

Processor 56 provides the measured output signal from current sensor 20c1 to controller 18 via fiber optic interface 58. In this regard, second current sensor circuit 40c1 does not require its own dedicated processor and fiber optic link, but instead uses the existing processor 56 and fiber optic link 58 of power cell 16c1 to communicate the measured output signal of current sensor 20c1 to controller 18. Although not shown in FIG. 4B, first current sensor circuit 40b1 may be the same as second current sensor circuit 40c1, and may use the processor and fiber optic link of power cell 16b1 to communicate the measured output signal of current sensor 20b1 to controller 18. The isolation requirement for each of current sensors 20b1 and 20c1 in FIG. 3B equals the rated output voltage of power cells 16b1 and 16c1, respectively (e.g., 480V).

In accordance with this invention, current sensor 20b1 measures an output current of power cell 16b1, and current sensor 20c1 measures an output current of power cell 16c1. The measured output current of power cell 16b1 substantially equals the "b" phase output current of power circuit 160b, and the measured output current of power cell 16c1 substantially equals the "c" phase output current of power circuit 160a. Thus, power cells 16b1 and 16c1 provide current feedback to controller 18 without requiring high voltage isolation corresponding to the rated voltage of the power circuit (e.g., 2400V).

Power cells in accordance with this invention may include more than two current sensors. For example, referring now to FIG. 3C, another alternative example embodiment of power circuit 160 is described. In particular, power circuit 160c includes current sensor circuits 40a1, 40b1, ..., 40b3, 40c3 coupled to corresponding power cells 16a1, 16b1, ..., 16b3, 16c3, respectively, and corresponding current sensors 20a1, 20b1, ..., 20b3, 20c3, respectively.

In this regard, each current sensor 20a1, 20b1, ..., 20b3, 20c3 is powered by and measures an output current of corresponding power cells 16a1, 16b1, ..., 16b3, 16c3, respectively. In addition, power cells 16a1, 16b1, ..., 16b3, 16c3 are used to communicate the measured output signals of corresponding current sensors 20a1, 20b1, ..., 20b3, 20c3, respectively, to controller 18. Such a configuration may be used to provide redundancy for current sensing. As in the embodiments of FIGS. 3A and 3B, the isolation requirement for each of current sensors 20a1, 20b1, ..., 20b3, 20c3 in FIG. 3C equals the rated output voltage of corresponding power cells 16a1, 16b1, . . . , 16c3, 16c3, respectively (e.g., 480V).

Figure 3C:
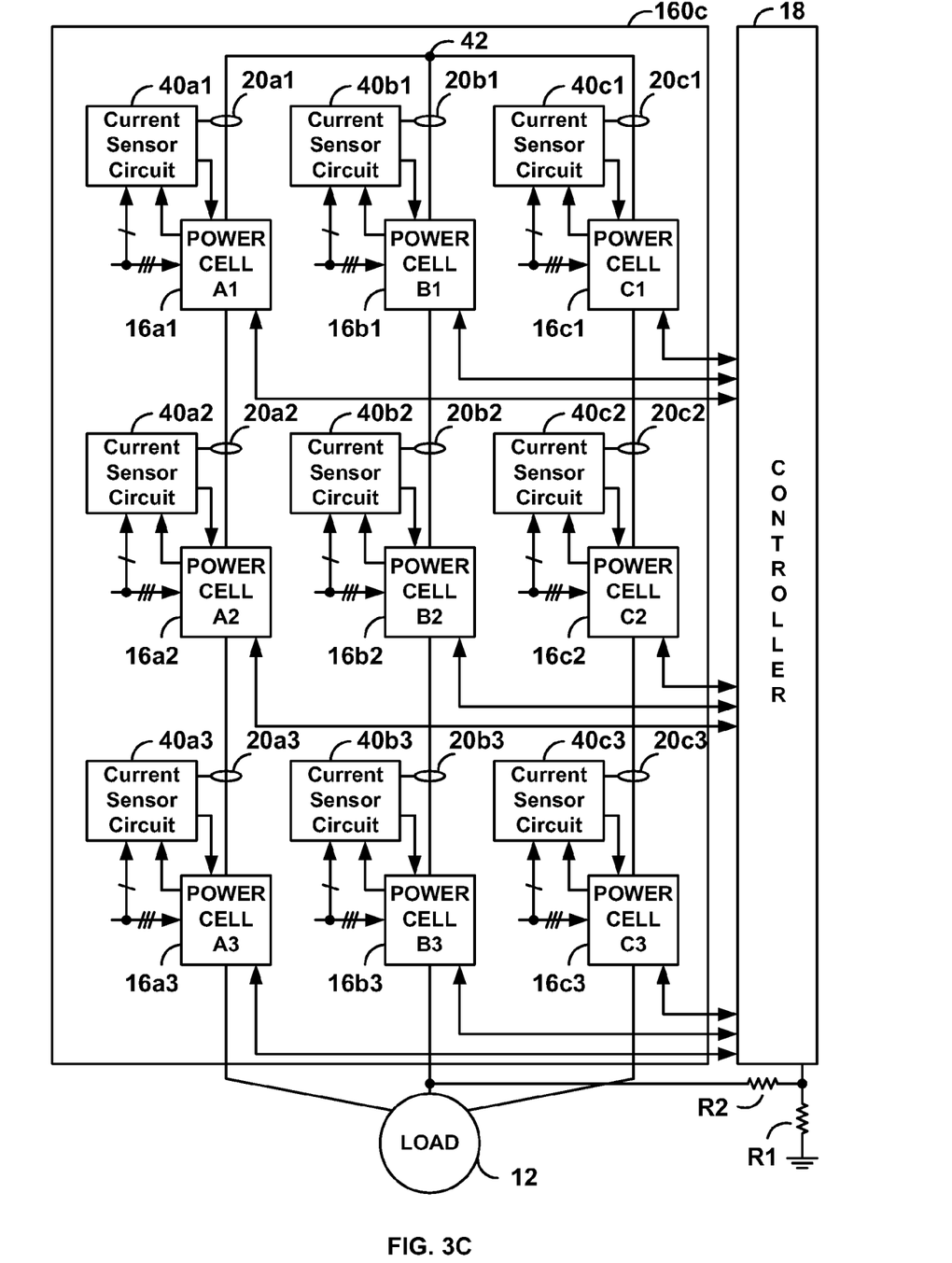

Persons of ordinary skill in the art will understand that separate current sensors 20a1, 20b1, . . . , 20b3, 20c3 and current sensor circuits 40a1, 40b1, . . . , 40b3, 40c3 may be used with all or fewer than all of power cells power cells 16a1, 16b1, . . . , 16b3, 16c3 depending on the amount of redundancy desired.

Figure 5:
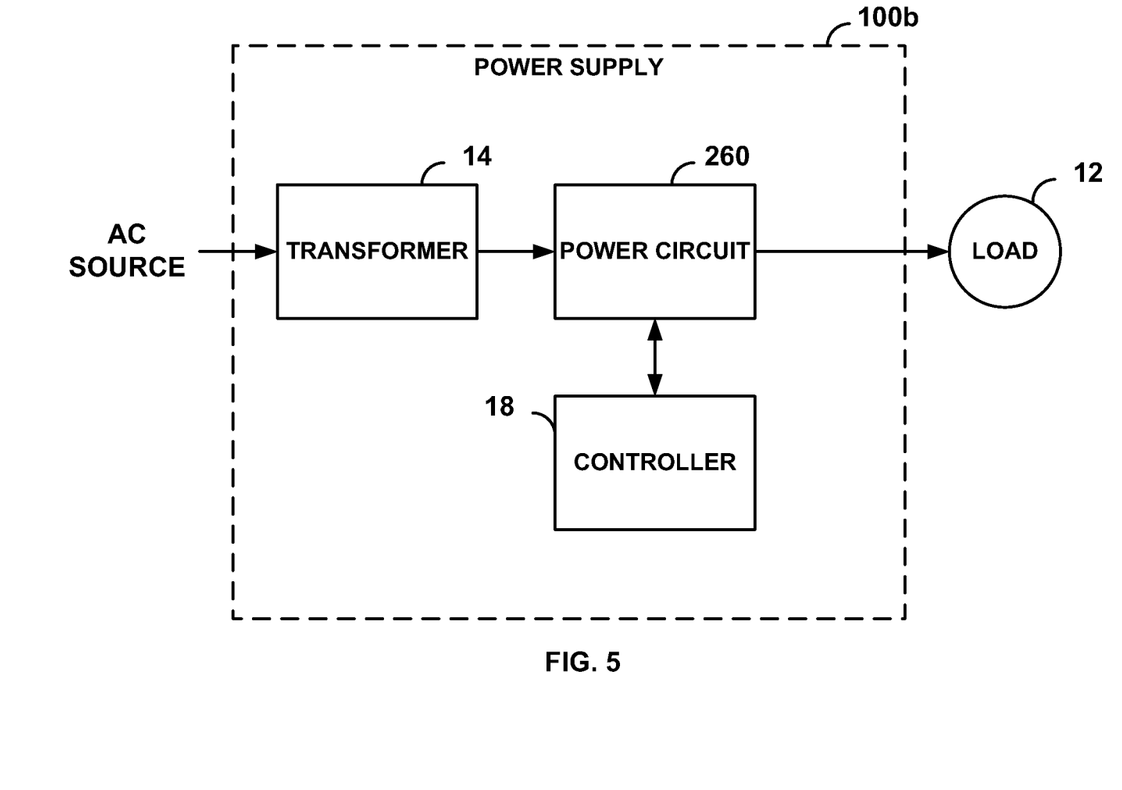

Referring now to FIG. 5, an alternative example multi-cell power supply 100b in accordance with this invention is described. Multi-cell power supply 100b includes transformer 14, a power circuit 260 and controller 18. As described in more detail below, unlike previously known multi-cell power supply 10 of FIG. 1A, and example multi-cell power supply 100a of FIG. 2, multi-cell power supply 100b does not include resistors R1 and R2 coupled to the output bus of power circuit 260.

Figure 6:
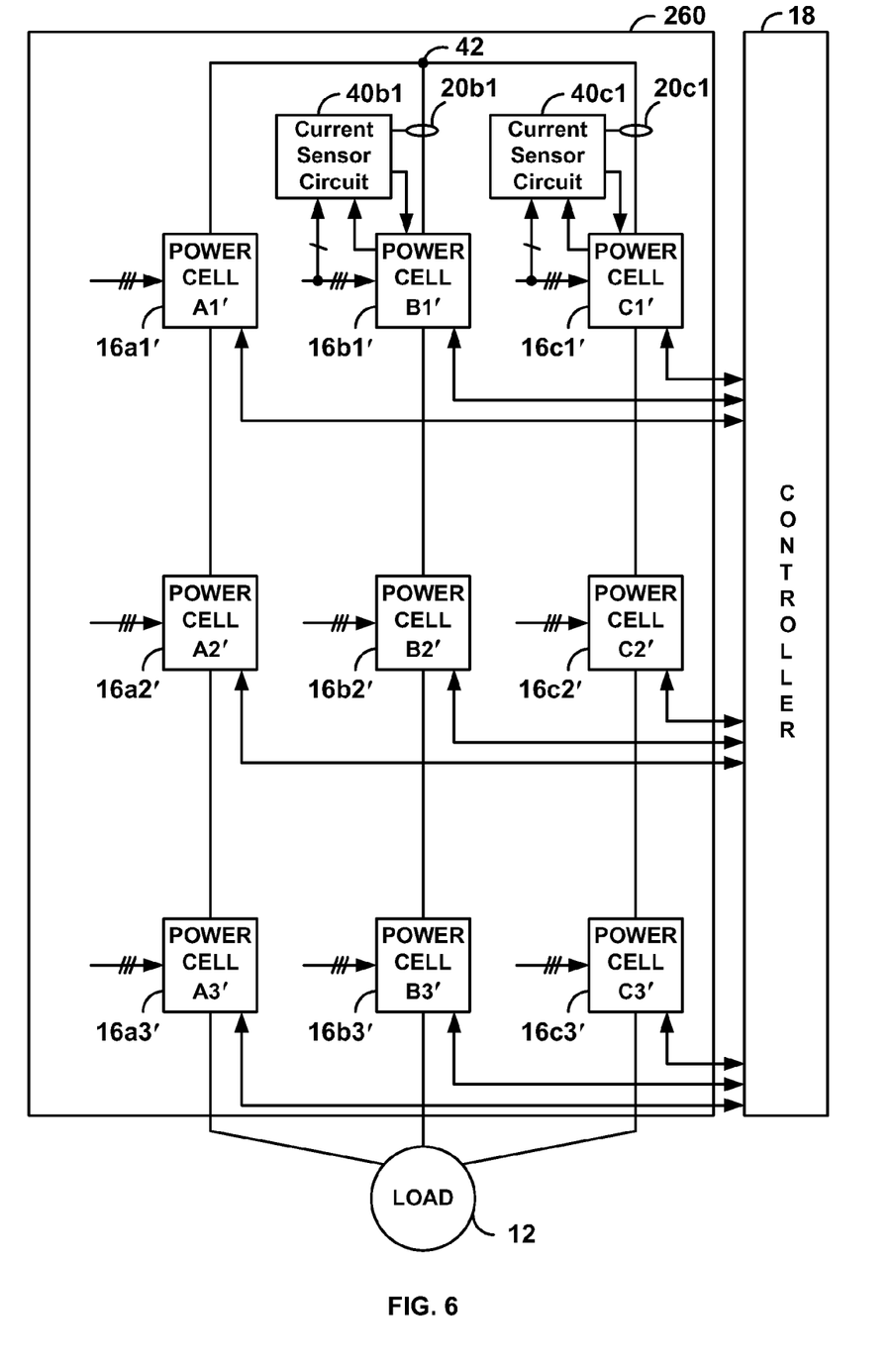

Referring now to FIG. 6, an example embodiment of power circuit 260 is described. Power circuit 260 includes nine power cells 16a1', 16b1', . . . , 16c3' that are coupled to transformer 14 (to avoid obscuring the drawing, transformer 14 is not shown) and also are coupled via communication links to controller 18. Persons of ordinary skill in the art will understand that more or less than nine power cells 16a1', 16b1', . . . , 16c3' may be used. Persons of ordinary skill in the art will understand that transformer 14 may include different configurations of primary winding 14p and secondary windings 14s1-14s9, and may include more or less than nine secondary windings 14s1-14s9 than those depicted in FIG. 1B.

Each output phase of power circuit 260 is fed by a group of series-connected power cells 16a1', 16b1', . . . , 16c3'. Power cells 16a1', 16a2' and 16a3' are coupled in a first phase group, power cells 16b1', 16b2' and 16b3' are coupled in a second phase group, and power cells 16c1', 16c2' and 16c3' are coupled in a third phase group, with the three phase groups joined in a WYE connection with a reference node 42. Persons of ordinary skill in the art will understand that more or less than three output phases may be used.

In addition, a first current sensor circuit 40b1 is coupled to current sensor 20b1 and power cell 16b1', and a second current sensor circuit 40c1 is coupled to current sensor 20c1 and power cell 16c1'. In this regard, each of current sensors 20b1 and 20c1 is powered by the input source supplying the power cells, and measures an output current of power cells 16b1' and 16c1', respectively. Persons of ordinary skill in that art will understand that current sensors 20b1 and 20c1 alternatively may be coupled to a single power cell 16b1' (such as in the embodiment of FIG. 3A). Likewise, separate current sensor 20a1, 20b1, . . . , 20b3 and 20c3 alternatively may be powered by corresponding power cells 16a1', 16b1', . . . , 16b3' and 16c3', respectively, (such as in the embodiment of FIG. 3C).

Figure 7:
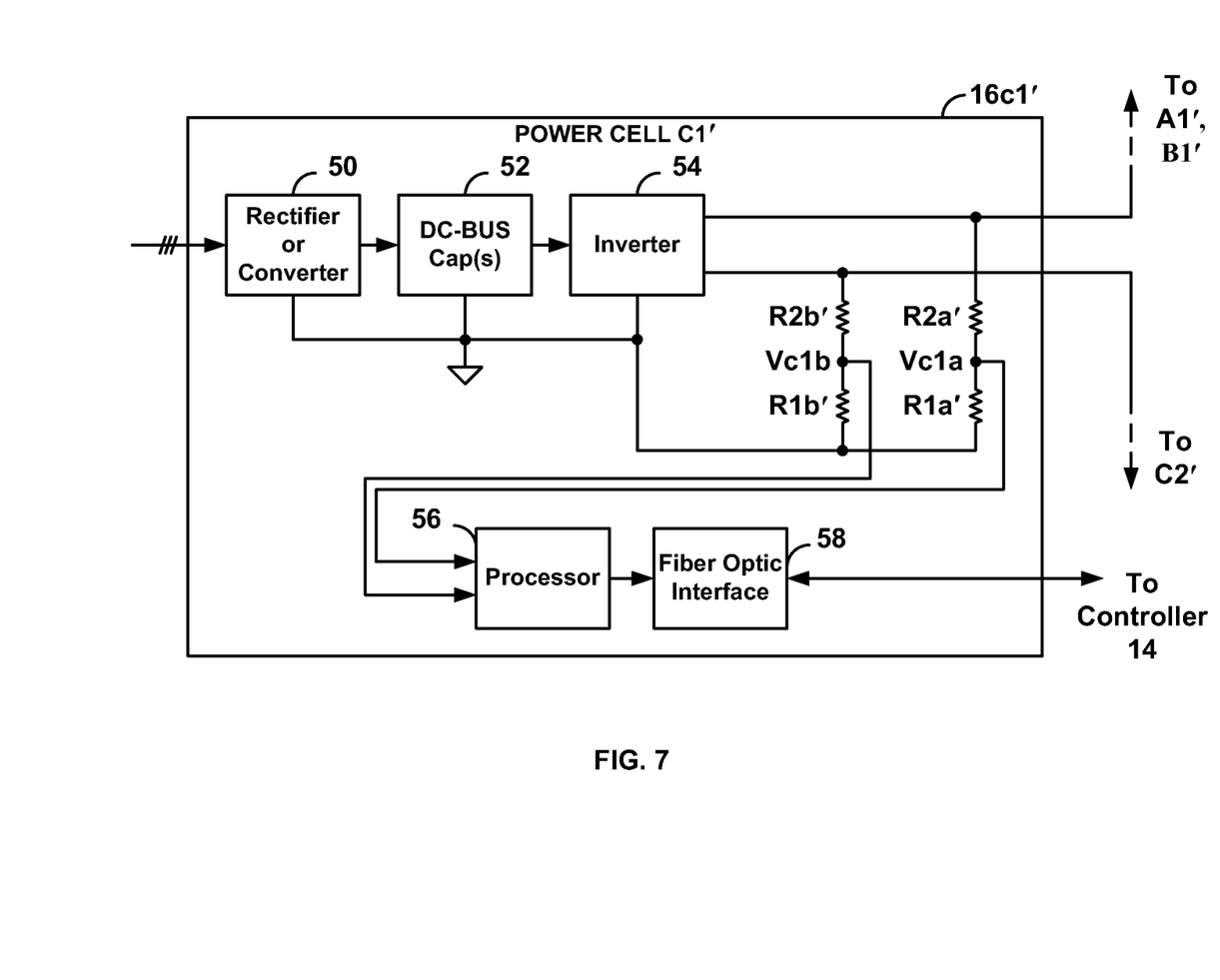

Referring now to FIG. 7, an example power cell 16c1' is described. Power cell 16c1' is similar to power cell 16c1 of FIG. 4A, but also includes a first resistor network R1a' and R2a' coupled between a first output terminal of inverter 54 and the floating ground node of power cell 16c1', and a second resistor network R1b' and R2b' coupled between a second output terminal of inverter 54 and the floating ground node of power cell 16c1'.

First resistor network R1a' and R2a' provides a first voltage feedback signal Vc1a to processor 56, and second resistor network R1b' and R2b' provides a second voltage feedback signal Vc1b to processor 56. Processor 56 communicates the voltage feedback signals Vc1a and Vc1b to controller 18 via fiber optic interface 58. For power cells that have a uni-polar output with one of the two terminals as a reference node, a single resistor network of R1a' and R2a' is sufficient to provide voltage feedback.

Referring again to FIG. 6, each of power cells 16a1', 16b1', . . . , 16b3', 16c3' similarly communicates corresponding voltage feedback signals to controller 18, which reconstructs the total voltage feedback signal of power circuit 260 by summing the individual voltage feedback signals from power cells 16a1', 16b1', . . . , 16b3' and 16c3'. For example, the voltage feedback signals for each phase may be determined as:

$$V_{FBA} = (Va1a - Va1b) + (Va2a - Va2b) + (Va3a - Va3b) \quad (1)$$

$$V_{FBB} = (Vb1a - Vb1b) + (Vb2a - Vb2b) + (Vb3a - Vb3b) \quad (2)$$

$$V_{FBC} = (Vc1a - Vc1b) + (Vc2a - Vc2b) + (Vc3a - Vc3b) \quad (3)$$

where Va1a and Va1b are the voltage feedback signals of power cell 16a1', Va2a and Va2b are the voltage feedback signals of power cell 16a2', Va3a and Va3b are the voltage feedback signals of power cell 16a3', Vb1a and Vb1b are the voltage feedback signals of power cell 16b1', Vb2a and Vb2b are the voltage feedback signals of power cell 16b2', Vb3a and Vb3b are the voltage feedback signals of power cell 16b3', Vc1a and Vc1b are the voltage feedback signals of power cell 16c1', Vc2a and Vc2b are the voltage feedback signals of power cell 16c2', and Vc3a and Vc3b are the voltage feedback signals of power cell 16c3'.

Referring again to FIG. 7, because first resistor network R1a' and R2a', and second resistor network R1b' and R2b' are each coupled between an output terminal of inverter 54 and the floating ground node of power cell 16c1', resistors R1a', R2a', R1b' and R2b' may be sized based on the fixed rated output voltage of power cell 16c1' (e.g., 480V). For example, R1a' and R1b' each may be about 4.8 kΩ, and R2a' and R2b' each may be between about 300 kΩ to about 1 MΩ, depending on the rated voltage of power cell 16c1'.

As a result, R2a' and R2b' may be more easily obtainable, and at lower cost than resistor R2 used in previously known multi-cell power supply 10. Further, whereas multiple values of resistor R2 are required depending on the rated output voltage of previously known multi-cell power supply 10, in example multi-cell power supply 100b of FIG. 5, a single value of resistors R2a' and R2b' is required based on the fixed rated voltage of the power cells 16a1', 16b1', . . . , 16b3' and 16c3'. Moreover, isolation between the controller 18 and the output voltage of multi-cell power supply 100b is achieved through the existing fiber optic communication links within each of power cells 16a1', 16b1', . . . , 16b3' and 16c3' without the need for additional circuitry or components.

The foregoing merely illustrates the principles of this invention, and various modifications can be made by persons of ordinary skill in the art without departing from the scope and spirit of this invention.

For example, modular medium voltage power supplies in accordance with this invention utilize H-bridge inverters as a modular component in the power cell that is connected in series to form the medium voltage output. Other power supply circuits use different structures for the modular component, such as half-bridge inverters or neutral-point clamped inverters to provide a medium voltage output. Current sensor circuit implementation in accordance with this invention may be incorporated into these power supply circuits to provide the same advantages of lower complexity and cost.

In addition, power supplies in accordance with this invention may be coupled between a source and a load, and may provide uni-directional or bi-directional power flow between the two.

The invention claimed is:

1. A multi-cell power supply for receiving power from a source and delivering power at an output terminal to a load, the multi-cell power supply comprising:
   a first power cell coupled to the source and providing a first output current, the first power cell comprising a first output terminal coupled to a reference node of the multi-cell power supply, and a second output terminal coupled to the output terminal; and
   a first current sensor circuit comprising:
      a first current sensor coupled to the first output terminal of the first power cell, wherein the first current sensor measures the first output current, and
      a power supply coupled to either the reference node or a floating ground node of the first power cell, wherein the power supply of the first current sensor circuit provides power to the first current sensor.

2. The multi-cell power supply of claim 1, wherein the power supply of the first current sensor circuit is coupled to the source.

3. The multi-cell power supply of claim 1, further comprising:
   a second power cell coupled to the source and providing a second output current, the second power cell comprising a first output terminal coupled to the reference node, and a second output terminal coupled to the output terminal,
   wherein the first current sensor circuit further comprises a second current sensor coupled to the first output terminal of the second power cell, wherein the second current sensor measures the second output current.

4. The multi-cell power supply of claim 1, wherein the power supply of the first current sensor circuit provides power to the second current sensor.

5. The multi-cell power supply of claim 1, further comprising:
   a second power cell coupled to the source and providing a second output current, the second power cell comprising a first output terminal coupled to the reference node, and a second output terminal coupled to the output terminal; and
   a second current sensor circuit comprising:
      a second current sensor coupled to the first output terminal of the second power cell, wherein the second current sensor measures the second output current, and
      a power supply coupled to either the reference node or a floating ground node of the first power cell, wherein the power supply of the second current sensor circuit provides power to the second current sensor.

6. The multi-cell power supply of claim 5, wherein the power supply of the first current sensor circuit is coupled to the source, and the power supply of the second current sensor circuit is coupled to the source.

7. The multi-cell power supply of claim 1, further comprising a control circuit, wherein the first current sensor circuit further comprises an optical interface coupled to the controller, and the first current sensor circuit communicates the measured first output current to the controller via the optical interface of the first current sensor circuit.

8. The multi-cell power supply of claim 1, further comprising a control circuit, wherein the first power cell comprises an optical interface coupled to the controller, and the first current sensor circuit communicates the measured first output current to the controller via the optical interface of the first power cell.

9. A multi-cell power supply for receiving power from a source and delivering power at an output terminal to a load, the multi-cell power supply comprising:
   a first power cell coupled to the source, the first power cell comprising:
      a first output terminal coupled to a reference node of the multi-cell power supply;
      a second output terminal coupled to the output terminal;
      a floating ground node;
      a first resistor network coupled between the first output terminal of the first power cell and the floating ground node of the first power cell; and
      a second resistor network coupled between the second output terminal of the first power cell and the floating ground node of the first power cell,
   wherein the first resistor network provides a first feedback voltage of the first power cell, and the second resistor network provides a second feedback voltage of the first power cell.

10. The multi-cell power supply of claim 9, wherein:
    the first resistor network comprises a first resistor and a second resistor;
    the second resistor network comprises a third resistor and a fourth resistor,
    wherein the first resistor, the second resistor, the third resistor or the fourth resistor are sized for an output rating of the first power cell.

11. The multi-cell power supply of claim 9, further comprising:
    a second power cell coupled to the source, the second power cell comprising:
       a first output terminal coupled to the second terminal of the first power cell;
       a second output terminal coupled to the output terminal;
       a floating ground terminal;
       a first resistor network coupled between the first output terminal of the second power cell and the floating ground terminal of the second power cell; and
       a second resistor network coupled between the second output terminal of the second power cell and the floating ground terminal of the second power cell,
    wherein the first resistor network provides a first feedback voltage of the second power cell, and the second resistor network provides a second feedback voltage of the second power cell.

12. The multi-cell power supply of claim 11, further comprising:
    a control circuit,
    wherein:
       the first power cell comprises an optical interface coupled to the controller, and the first power cell communicates the first feedback voltage and the second feedback voltage of the first power cell to the controller via the optical interface of the first power cell,
       the second power cell comprises an optical interface coupled to the controller, and the second power cell communicates the first feedback voltage and the second feedback voltage of the second power cell to the controller via the optical interface of the second power cell, and
       the controller determines a feedback voltage of the multi-cell power supply based on the first feedback voltage and the second feedback voltage of the first power cell, and the first feedback voltage and the second feedback voltage of the second power cell.

13. A method for use with a multi-cell power supply that receives power from a source and delivers power at an output terminal to a load, the method comprising:
    coupling a first power cell to the source, the first power cell providing a first output current;

coupling a first output terminal of the first power cell to a reference node of the multi-cell power supply;

coupling a second output terminal of the first power cell to the output terminal;

coupling a first current sensor circuit to the first power cell, the first current sensor circuit comprising a first current sensor and a power supply;

coupling the first current sensor to the first output terminal of the first power cell;

coupling the power supply of the first current sensor circuit to either the reference node or a floating ground node of the first power cell, wherein the power supply of the first current sensor circuit provides power to the first current sensor; and using the first current sensor to measure the first output current.

14. The method of claim 13, further comprising coupling the power supply of the first current sensor circuit to the source.

15. The method of claim 13, further comprising:

coupling a second power cell to the source, the second power cell providing a second output current;

coupling a first output terminal of the second power cell to the reference node;

coupling a second output terminal of the second power cell to the output terminal;

coupling the first current sensor circuit to the second power cell, the first current sensor circuit comprising a second current sensor;

coupling the second current sensor to the first output terminal of the second power cell; and using the second current sensor to measure the second output current.

16. The method of claim 15, wherein the power supply of the first current sensor circuit provides power to the second current sensor.

17. The method of claim 13, further comprising:

coupling a second power cell to the source, the second power cell providing a second output current;

coupling a first output terminal of the second power cell to the reference node;

coupling a second output terminal of the second power cell to the output terminal;

providing a second current sensor circuit comprising a second current sensor and a power supply;

coupling the second current sensor to the first output terminal of the second power cell;

coupling to power supply of the second current sensor circuit to either the reference node or a floating ground node of the second power cell, wherein the power supply of the second current sensor circuit provides power to the second current sensor; and using the second current sensor to measure the second output current.

18. The method of claim 13, further comprising coupling the power supply of the first current sensor circuit to the source, and coupling the power supply of the second current sensor circuit to the source.

19. The method of claim 13, wherein the first current sensor circuit further comprises an optical interface, and wherein the method further comprises:

providing a control circuit coupled to the optical interface; and communicating the measured first output current to the controller via the optical interface of the first current sensor circuit.

20. The method of claim 13, wherein the first power cell comprises an optical interface, and wherein the method further comprises:

providing a control circuit coupled to the optical interface; and communicating the measured first output current to the controller via the optical interface of the first power cell.

* * * * *